(12) United States Patent
Gupta et al.

(10) Patent No.: US 8,451,159 B1
(45) Date of Patent: May 28, 2013

(54) PIPELINED ADC WITH A VCO-BASED STAGE

(75) Inventors: Amit K. Gupta, Richardson, TX (US); Krishnasawamy Nagaraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 13/297,004

(22) Filed: Nov. 15, 2011

Related U.S. Application Data

(60) Provisional application No. 61/559,506, filed on Nov. 14, 2011.

(51) Int. Cl.
*H03M 1/14* (2006.01)

(52) U.S. Cl.
USPC .................. 341/156; 341/157; 341/166

(58) Field of Classification Search
USPC ............... 341/111, 156, 157, 161–163, 166
See application file for complete search history.

(56) References Cited

U.S. PATENT DOCUMENTS

| | | | |
|---|---|---|---|
| 6,809,676 B1 * | 10/2004 | Younis et al. | 341/157 |
| 7,522,084 B2 * | 4/2009 | Huang et al. | 341/157 |
| 7,528,760 B2 | 5/2009 | Forejt | |
| 7,667,633 B2 * | 2/2010 | Choi et al. | 341/166 |
| 2011/0084863 A1 * | 4/2011 | Chiu et al. | 341/141 |

OTHER PUBLICATIONS

Gupta, A.K. et al., A Two-Stage ADC Architecture With VCO-Based Second Stage, IEEE Transactions on Circuits and Systems—II: Express Briefs, vol. 58, No. 11, Nov. 2011, pp. 734-738.*

"Optimizing the Stage Resolution in Pipelined, Multistage, Analog-to-Digital Converter for Video-Rate Applications," IEEE Trans. Circuits Syst II, Analog Digit. Signal Process., vol. 39, No. 8, Aug. 1992, pp. 516-523 (S.H. Lewis).

"Digitial Background Correction of Harmonic Distortion in Pipelined ADCs," IEEE Trans. Circuits Syst. I: Reg. Papers, vol. 53, No. 9, Sep. 2006, pp. 1885-1895 (Panigada, et al.).

"Background Interstage Gain Calibration Technique for Pipelined ADCs," IEEE Trans. Circuits Syst.I: Reg. Papers, vol. 52, No. 1, Jan. 2005, pp. 32-43 (Keane, et al.).

"A 1.2V 250mW 14b 100MS/s Digitally Calibrated Piepline ADC in 90nm CMOS," VLSI Circuits, 2008 IEEE Symposium on , Jun. 18-20, 2008, pp. 74-75 (Van de Vel, et al.).

"A 65nm CMOS 1.2V 12b 30MS/s ADC With Capacitive Reference Scaling," Custom Integrated Circuits Conference, 2008. CICC 2008. IEEE , Sep. 21-24, 2008, pp. 165-168 (Lee, et al.).

"A 10mW 9.7ENOB 80MSPS Pipeline ADC in 65nm CMOS Process Without Any Special Mask Requirement and With Single 1.3V Supply," Custom Integrated Circuits Conference, 2009. CICC '09. IEEE , Sep. 13-16, 2009, pp. 165-168 (Das, et al.).

(Continued)

*Primary Examiner* — Howard Williams
(74) *Attorney, Agent, or Firm* — John R. Pessetto; W. James Brady; Frederick J. Telecky, Jr.

(57) ABSTRACT

A method for converting an analog signal to a digital signal is provided. Initially, a digital representation of a portion of an analog signal is generated. Residue of the analog signal is then sampled at a sampling instant so as to generate a residue sample. A signal having a frequency that is proportional to the voltage of the residue sample is generated, and the signal is measured to generate coarse and fine measurements of the frequency. A digital representation of the residue sample from the coarse and fine measurements is then generated.

20 Claims, 5 Drawing Sheets

OTHER PUBLICATIONS

"A 12b 50MS/s 3.5mW SAR Assisted 2-Stage Pipeline ADC," IEEE Symposium on VLSI Circuits (VLSIC), 2010, Jun. 16-18, 2010, pp. 239-240 (Lee, et al.).

"A 10-Bit Pipeline ADC Using 40-dB Opamps and Calibrated Customized References," ASIC, 2007. ASICON '07. 7th International Conference, Oct. 22-25, 2007, pp. 249-252 (Chen, et al.).

"Reference Refreshing Cyclic Analog-to-Digital and Digital-to-Analog Converters," IEEE J. Solid-State Circuits, vol. SC-21, No. 4, Aug. 1986, pp. 544-554 (Shih, et al.).

"A 9b 14 μW 0.06mm2 PPM ADC in 90nm Digital CMOS," IEEE International Solid-State Circuits Conference—Digest of Technical Papers, 2009. ISSCC 2009., Feb. 8-12, 2009, pp. 168-169,169a (Naraghi, et al.).

"Delay-Line Based Analog-to-Digital Converters," Circuits and Systems II: Express Briefs, Circuits and Systems II: Express Briefs, IEEE Transactions on , vol. 56, No. 6, Jun. 2009, pp. 464-468 (Li, et al.).

"A 0.0027-mm2, 9.5-Bit 50-MS/s All-Digital A/D Converter TAD in 65-nm Digital CMOS," 16th IEEE International Conference on Electronics, Circuits, and Systems, 2009. ICECS 2009, Dec. 13-16, 2009, pp. 271-274 (Watanabe, et al.).

"Analysis and Design of Voltage-Controlled Oscillator Based on Analog-to-Digital Converter," IEEE Transactions on Circuits and Systems I: Regular Papers, vol. 57, No. 1, Jan. 2010, pp. 18-30 (Kim, et al.).

"A 12-Bit, 10-MHz Bandwidth, Continuous-Time $\Sigma\Delta$ ADC With a 5-Bit, 950-MS/s VCO-Based Quantizer," IEEE Journal of Solid-State Circuits, vol. 43, No. 4, Apr. 2008, pp. 805-814 (Straayer, et al.).

"A 0.13 μm CMOS 78dB SNDR 87mW 20MHz BW CT $\Sigma\Delta$ ADC With VCO-Based Integrator and Quantizer," Solid-State Circuits Conference—Digest of Technical Papers, 2009. ISSCC 2009. IEEE International , Feb. 8-12, 2009 pp. 170-171,171a (Park, et al.).

"A Mostly-Digital Variable-Rate Continuous-Time Delta-Sigma Modulator ADC," IEEE Journal of Solid-State Circuits, vol. 45, No. 12, Dec. 2010, pp. 2634-2646 (Taylor, et al.).

"Noise-Shaped Integrating Quantisers in !# Modulators," Electronics Letters , vol. 45, No. 12, Jun. 4, 2009, pp. 612-613 (Maghari, et al.).

"A Highly Linear CMOS Current-Controlled Oscillator Using a Novel Frequency Detector," IEEE International Symposium on Circuits and Systems, 2008. ISCAS 2008 , May 18-21, 2008, pp. 2841-2844 (Su, et al.).

* cited by examiner

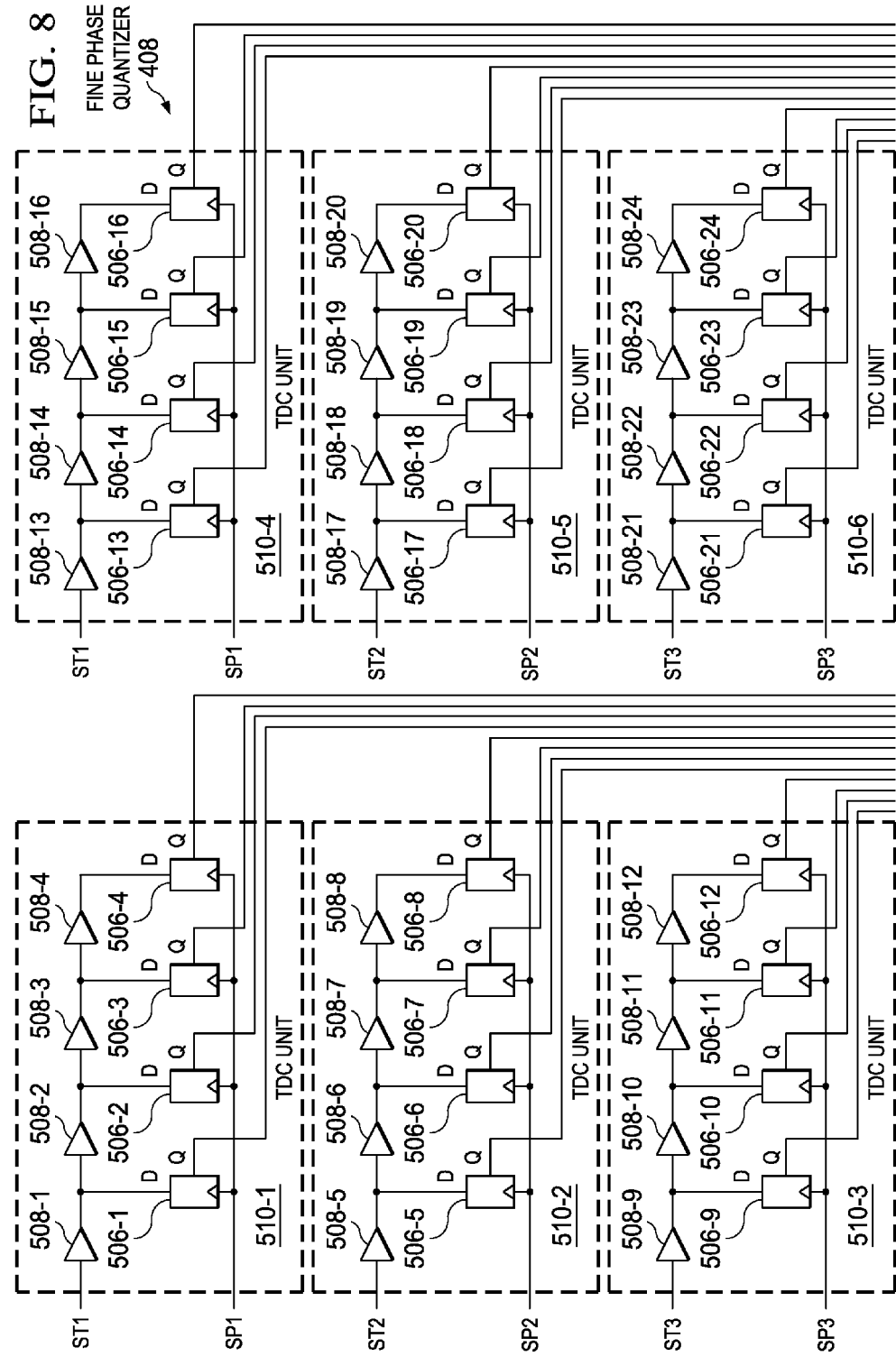

PIPELINED ADC WITH A VCO-BASED STAGE

CROSS-REFERENCE TO RELATED APPLICATIONS

This application claims priority to U.S. Provisional Patent Application Ser. No. 61/559,506 filed on Nov. 14, 2011, which is hereby incorporated by reference for all purposes.

TECHNICAL FIELD

The invention relates generally to an analog-to-digital converter (ADC) and, more particularly, to a pipelined ADC having a voltage controlled oscillator (VCO) based stage.

BACKGROUND

Turning to FIGS. 1 and 2, an example of a conventional pipelined ADC 100 can be seen. ADC 100 generally comprises a pipeline (which receives an analog input signal AIN) that provides digital signals to a digital output circuit 108 so that a digital output signal DOUT can be generated. The pipeline is generally comprised of a sample-and-hold (S/H) circuit 102, ADC stages 104-1 to 104-N (which are generally arranged in a sequence), and sub-ADC 106. Each of the ADC stages 102-1 to 102-N generally comprises a sub-ADC 202, digital-to-analog converter (DAC) 204, an adder 206, and a residue amplifier 208. In operation, as shown in this example, S/H circuit 102 receives an analog input signal AIN and samples the signal based on sample signal SAMPLE. Each stage 104-1 to 104-N resolves a predetermined number of bits and passes its residue onto the next stage. To do this, sub-ADC 202 generates a digital representation of its input signal (either from the S/H circuit 102 or the previous stage); this digital representation is then provided to output circuit 108 and DAC 204. Residue amplifier 122 then amplifies the difference between the input signal (either from the S/H circuit 102 or the previous stage) and the output from DAC 204 from adder 206, which is the residue signal or residue of the stage. The final stage 104-N of the sequence then provides its residue to sub-ADC 106, which provides its digital representation of the residue from stage 104-N to digital output circuit 106.

One issue that arises with ADC 100 is interstage gain. This gain should be very accurate to maintain good linearity performance, and in order to generate this high accuracy gain a large open loop gain for the residue amplifier is employed. As technology scales to shorter channel lengths, supply voltages drop, and it becomes difficult to design the residue amplifier 208 for each of stages 104-1 to 104-N so as to have sufficiently high gain. Thus, there is a need for an improved pipelined ADC.

Some other conventional circuits are: S. H. Lewis, "Optimizing the stage resolution in pipelined, multistage, analog-to-digital converter for video-rate applications," *IEEE Trans. Circuits Syst II, Analog Digit. Signal Process.*, vol. 39, no. 8, pp. 516-523, August 1992; Panigada et al., "Digital background correction of harmonic distortion in pipelined ADCs," *IEEE Trans. Circuits Syst. I: Reg. Papers*, vol. 53, no. 9, pp. 1885-1895, September 2006; Keane et al., "Background interstage gain calibration technique for pipelined ADCs," *IEEE Trans. Circuits Syst. I: Reg. Papers*, vol. 52, no. 1, pp. 32-43, January 2005; Van de Vel et al., "A 1.2V 250 mW 14 b 100 MS/s digitally calibrated pipeline ADC in 90 nm CMOS," *VLSI Circuits, 2008 IEEE Symposium on*, pp. 74-75, 18-20 Jun. 2008; Lee et al., "A 65 nm CMOS1.2V 12 b 30 MS/s ADC with capacitive reference scaling," *Custom Integrated Circuits Conference, 2008. CICC 2008. IEEE*, pp. 165-168, 21-24 Sep. 2008; Das et al., "A 10 mW 9.7ENOB 80 MSPS pipeline ADC in 65 nm CMOS process without any special mask requirement and with single 1.3V supply," *Custom Integrated Circuits Conference, 2009. CICC '09. IEEE*, pp. 165-168, 13-16 Sep. 2009; Lee et al., "A 12 b 50 MS/s 3.5 mW SAR assisted 2-stage pipeline ADC," *VLSI Circuits (VLSIC), 2010 IEEE Symposium on*, pp. 239-240, 16-18 Jun. 2010; Chen et al., "A 10-bit pipeline ADC using 40-dB opamps and calibrated customized references," *ASIC, 2007. ASICON '07. 7th International Conference on*, pp. 249-252, 22-25 Oct. 2007; Shih et al., "Reference refreshing cyclic analog-to digital and digital-to-analog converters," *IEEE J. Solid-State Circuits*, vol. SC-21, no. 4, pp. 544-554, August 1986; Naraghi et al., "A 9 b 14 μW 0.06 mm2 PPM ADC in 90 nm digital CMOS," *Solid-State Circuits Conference—Digest of Technical Papers, 2009. ISSCC 2009. IEEE International*, pp. 168-169,169a, 8-12 Feb. 2009; Li et al., "Delay-Line-Based Analog-to-Digital Converters," *Circuits and Systems II: Express Briefs, IEEE Transactions on*, vol. 56, no. 6, pp. 464-468, June 2009; Watanabe et al., "A 0.0027-mm2 9.5-bit 50-MS/s all-digital A/D converter TAD in 65-nm digital CMOS," *Electronics, Circuits, and Systems, 2009. ICECS 2009. 16th IEEE International Conference on*, pp. 271-274, 13-16 Dec. 2009; Kim et al., "Analysis and Design of Voltage-Controlled Oscillator Based Analog-to-Digital Converter," *Circuits and Systems I: Regular Papers, IEEE Transactions on*, vol. 57, no. 1, pp. 18-30, January 2010; Straayer et al., "A 12-Bit, 10-MHz Bandwidth, Continuous-Time ΣΔ ADC With a 5-Bit, 950-MS/s VCO-Based Quantizer," *Solid-State Circuits, IEEE Journal of*, vol. 43, no. 4, pp. 805-814, April 2008; Park et al., "A 0.13 μm CMOS 78 dB SNDR 87 mW 20 MHz BW CT ΔΣ ADC with VCO-based integrator and quantizer," *Solid-State Circuits Conference—Digest of Technical Papers, 2009. ISSCC 2009. IEEE International*, pp. 170-171,171a, 8-12 Feb. 2009; Taylor et al., "A Mostly-Digital Variable-Rate Continuous-Time Delta-Sigma Modulator ADC," *Solid-State Circuits, IEEE Journal of*, vol. 45, no. 12, pp. 2634-2646, December 2010; Maghari et al., "Noise-shaped integrating quantisers in ΔΣ modulators," *Electronics Letters*, vol. 45, no. 12, pp. 612-613, Jun. 4, 2009; Su et al., "A highly linear CMOS current-controlled oscillator using a novel frequency detector," *Circuits and Systems, 2008. ISCAS 2008. IEEE International Symposium on*, pp. 2841-2844, 18-21 May 2008; and U.S. Pat. No. 7,528,760.

SUMMARY

An embodiment of the present invention, accordingly, provides an apparatus. The apparatus comprises a plurality of data conversion stages coupled together in a sequence to form a pipeline, wherein the last data conversion stage of the sequence includes: a sample-and-hold (S/H) circuit; a voltage controlled oscillator (VCO) that is coupled to the S/H circuit; a coarse phase quantizer that is coupled to the VCO; a fine phase quantizer that is coupled to the VCO; and a controller that is coupled to the coarse and fine phase quantizer; and an output circuit that is coupled to each of the plurality of data conversion stages.

In accordance with an embodiment of the present invention, the coarse phase quantizer further comprises a counter that is coupled to receive an output signal from the VCO and that receives a start signal.

In accordance with an embodiment of the present invention, the fine phase quantizer further comprises: a first time-to-digital converter (TDC) unit that is coupled to the VCO and the controller, wherein the first TDC unit measures a first interval between the an edge of the start signal initiating the counter and a first edge of the output signal from the VCO; a second TDC unit that is coupled to the VCO and the controller, wherein the second TDC measures the period of the output signal from the VCO; and a third TDC unit that is coupled to the VCO and the controller, wherein the third TDC measures a second interval between an edge of the start signal stopping the counter and a second edge of the output signal from the VCO.

In accordance with an embodiment of the present invention, the controller obtains a fractional count by dividing the difference between the first and second intervals by the period of the output signal from the VCO.

In accordance with an embodiment of the present invention, the edge of the start signal initiating the counter is a rising edge of the start signal, and wherein the first edge of the output signal from the VCO is the first rising edge of the output signal from the VCO following the rising edge of the start signal, and wherein edge of the start signal stopping the counter is a falling edge of the start signal, and wherein second edge of the output signal from the VCO is the first falling edge of the output signal from the VCO following the falling edge of the start signal.

In accordance with an embodiment of the present invention, the VCO further comprises a ring oscillator.

In accordance with an embodiment of the present invention, the first stage of the sequence further comprises: an input terminal; a sub-analog-to-digital converter (ADC) that is coupled to the input terminal and to the output circuit; and a multiplying digital-to-analog converter (MDAC) that is coupled to the sub-ADC.

In accordance with an embodiment of the present invention, a method is provided. The method comprises generating a digital representation of a portion of an analog signal; sampling residue of the analog signal at a sampling instant so as to generate a residue sample; generating a signal having a frequency that is proportional to the voltage of the residue sample; measuring the signal to generate coarse and fine measurements of the frequency; and generating a digital representation of the residue sample from the coarse and fine measurements.

In accordance with an embodiment of the present invention, the step of measuring the signal further comprises counting a number of periods of the signal during a measurement interval to generate the coarse measurement.

In accordance with an embodiment of the present invention, the step of measuring the signal further comprises: measuring the length of a first interval between initiation of the measurement interval and a first edge of the signal; measuring the period of the signal; and measuring the length of a second interval between the end of the measurement interval and a second edge of the output signal.

In accordance with an embodiment of the present invention, the step of measuring the signal further comprises determine the fine measurement by dividing the difference between the lengths of first and second intervals by the period of the signal.

In accordance with an embodiment of the present invention, the analog signal further comprises a first analog signal, wherein the step of generating the digital representation of the portion of the first analog signal further comprises: resolving a plurality of bits that correspond to the portion of the first analog signal; converting the plurality of bits into a second analog signal; and determining a difference between the first and second analog signals to generate the residue of the first analog signal.

In accordance with an embodiment of the present invention, an apparatus is provided. The apparatus comprises an ADC pipeline having: a first stage that generates a digital representation of a portion of an analog signal and that generates a residue signal; a second stage having: an S/H circuit that is coupled to the first stage so as to receive the residue signal; a VCO that is coupled to the S/H circuit; a coarse phase quantizer that is coupled to the VCO; a fine phase quantizer that is coupled to the VCO; and a controller that is coupled to the coarse and fine phase quantizer and that generates a digital representation of the residue signal; and an output circuit that is coupled to the first stage and the controller so as to receive the digital representations of the portion of the analog signal and the residue signal and that generates a digital signal from the digital representations of the portion of the analog signal and the residue signal.

In accordance with an embodiment of the present invention, the analog and residue signals are differential, and wherein the counter, the first TDC unit, the second TDC unit, and the third TDC unit further and respectively comprise positive and negative counters, positive and negative first TDC units, positive and negative second TDC units, and positive and negative third TDC units, and wherein the VCO further comprises: a differential input pair that receives a sample of the differential residue signal from the S/H circuit; first and second current minor that are coupled to the differential input pair; a first set of inverters coupled together to form a first ring, wherein the first current mirror is coupled to each of the inverters from the first set of inverters, and wherein at least one of the inverters from the first set of inverters is coupled to the positive counter, the positive first TDC unit, the positive second TDC unit, and the positive third TDC unit; and a second set of inverters coupled together to form a second ring, wherein the second current minor is coupled to each of the inverters from the second set of inverters, and wherein at least one of the inverters from the second set of inverters is coupled to the negative counter, the negative first TDC unit, the negative second TDC unit, and the negative third TDC unit.

In accordance with an embodiment of the present invention, the first stage further comprises: an input terminal; a sub-ADC that is coupled to the input terminal and to the output circuit; and an MDAC that is coupled to the sub-ADC.

In accordance with an embodiment of the present invention, the sub-ADC is a 4-bit flash ADC, and wherein the MDAC is a 4-bit MDAC, and wherein the digital representation of the residue signal is 9 bits wide.

In accordance with an embodiment of the present invention,

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 is a diagram of an example of the fine phase quantizer of the sub-ADC of FIG. 5.

DETAILED DESCRIPTION

Figure 1:
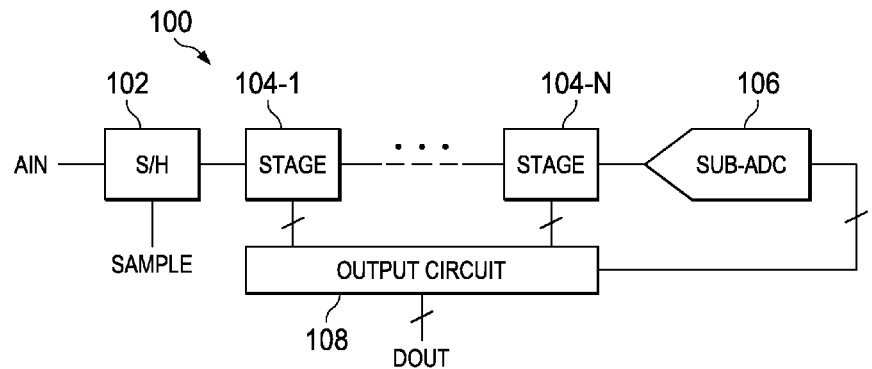
FIG. 1 is a diagram of an example of a conventional pipelined ADC.
Figure 2:
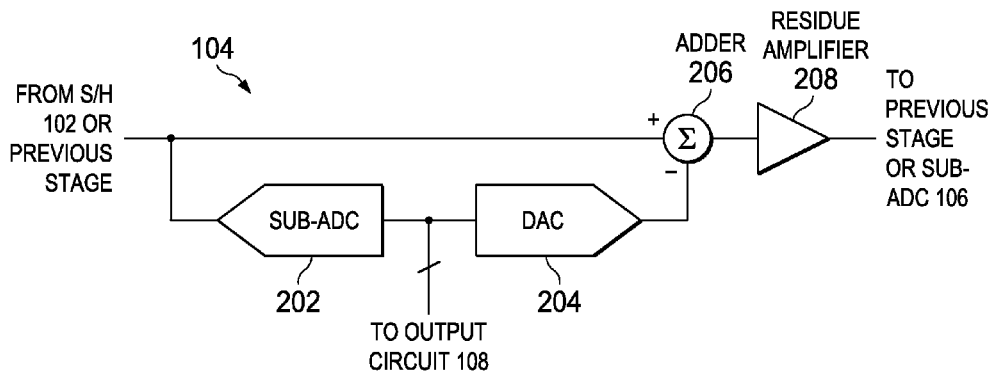
FIG. 2 is a diagram of an example of a stage of the pipelined ADC of FIG. 1.

Refer now to the drawings wherein depicted elements are, for the sake of clarity, not necessarily shown to scale and wherein like or similar elements are designated by the same reference numeral through the several views.

Figure 3:
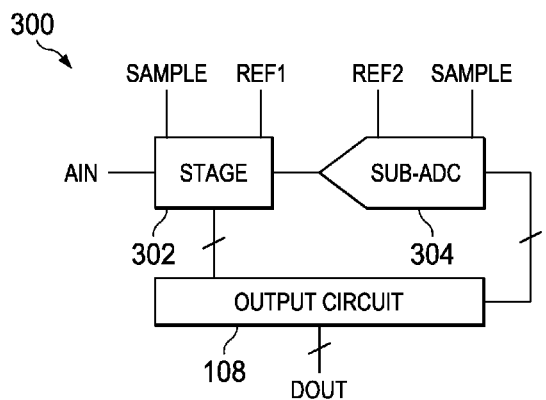
FIG. 3 is a diagram of an example of a pipelined ADC in accordance with an embodiment of the present invention.
Figure 4:
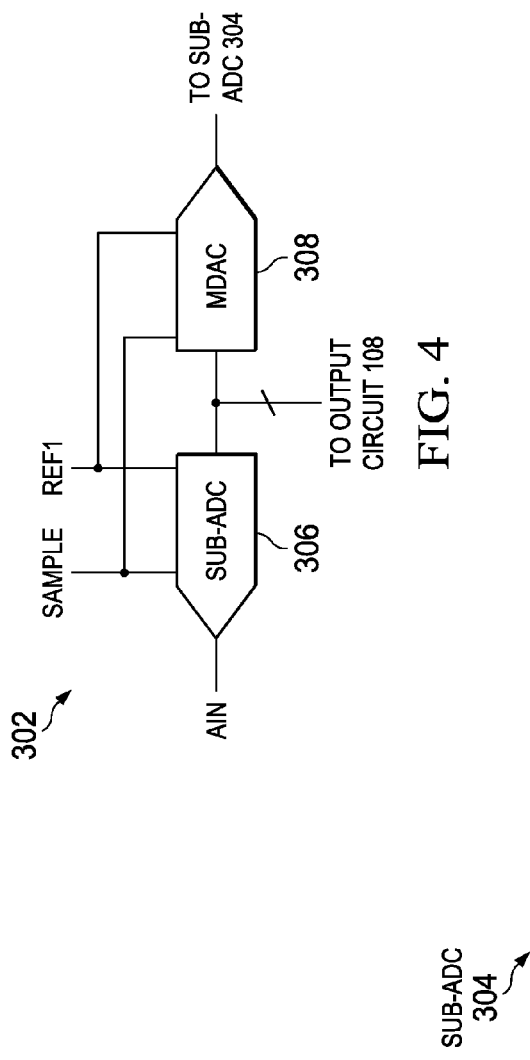
FIG. 4 is a diagram of the ADC pipeline stage of FIG. 3.

Turning to FIGS. 3 and 4, an example of a pipelined ADC 300 in accordance with an embodiment of the present invention can be seen. As shown, ADC 300 is generally comprised of a pipeline having stage 302 and sub-ADC 304 (where each can be thought of as a data conversion stage) and output circuit 108. Stage 302 generally comprises a sub-ADC 306 (which can for example be a flash ADC and can, for example, have 4 bits of resolution) that resolves a portion of the analog signal AIN and a multiplying DAC or MDAC 308 (which can for example have a gain of 4 and can, for example, have 4 bits of resolution) that generates an amplified residue signal for sub-ADC 308. The sub-ADC 304 (which is a VCO-based ADC and which can, for example, have a resolution of 9 bits) is able to resolve the residue from stage 302. Additionally, the stage 302 can use reference voltage REF1 to resolve a portion of the analog signal AIN (i.e., 5 bits), and sub-ADC 304 can use reference voltage REF2 to resolve the residue signal from stage 302 (i.e., 9 bits). Because of the configuration of ADC 300, reference voltage REF2 can be up to, for example, one-eighth of reference voltage REF1.

Figure 5:
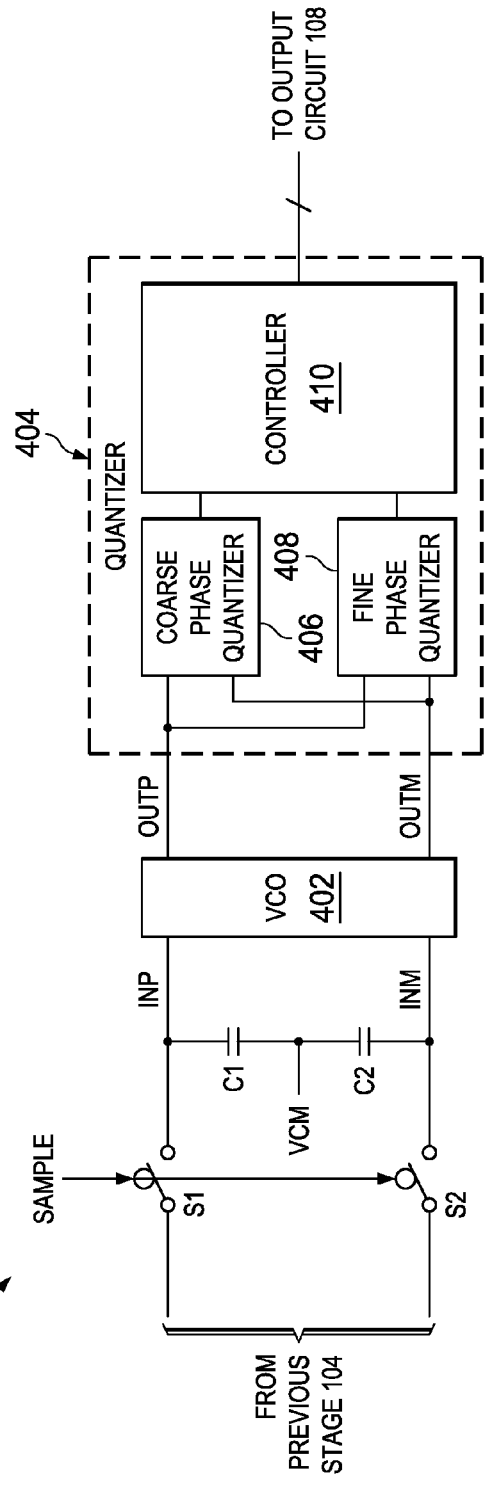
FIG. 5 is a diagram of an example of the sub-ADC of FIG. 3.

In order to be able to accomplish this task, sub-ADC 304 (which can be seen in greater detail in FIG. 5) uses coarse and fine measurements to resolve the residue signal. In operation, the residue signal is provided to the S/H circuit (which is controlled by the sample signal SAMPLE). During the hold phase of sample signal SAMPLE (which is generally a sampling instant), switches S1 and S2 of the S/H circuit are closed so that capacitors C1 and C2 (which are initially charged with common mode voltage VCM) can sample the residue signal. During the sample phase of the sample signal SAMPLE, switches S1 and S2 are open, and the capacitors C1 and C2 provide an input signal INP and INM (which, as shown in this example, is a differential signal) to the VCO 402. The VCO 402 then generates a differential output signal OUTP and OUTM based on the input signal INM and INP. This output signal OUTP and OUTM are then used by the coarse phase quantizer 406 and fine phase quantizer 408 of quantizer 404 to generate coarse and fine count values or measurements, respectively. The controller 410 can then use the coarse and fine measurements to determine a digital representation of the residue signal for the output circuit 108.

Figure 6:
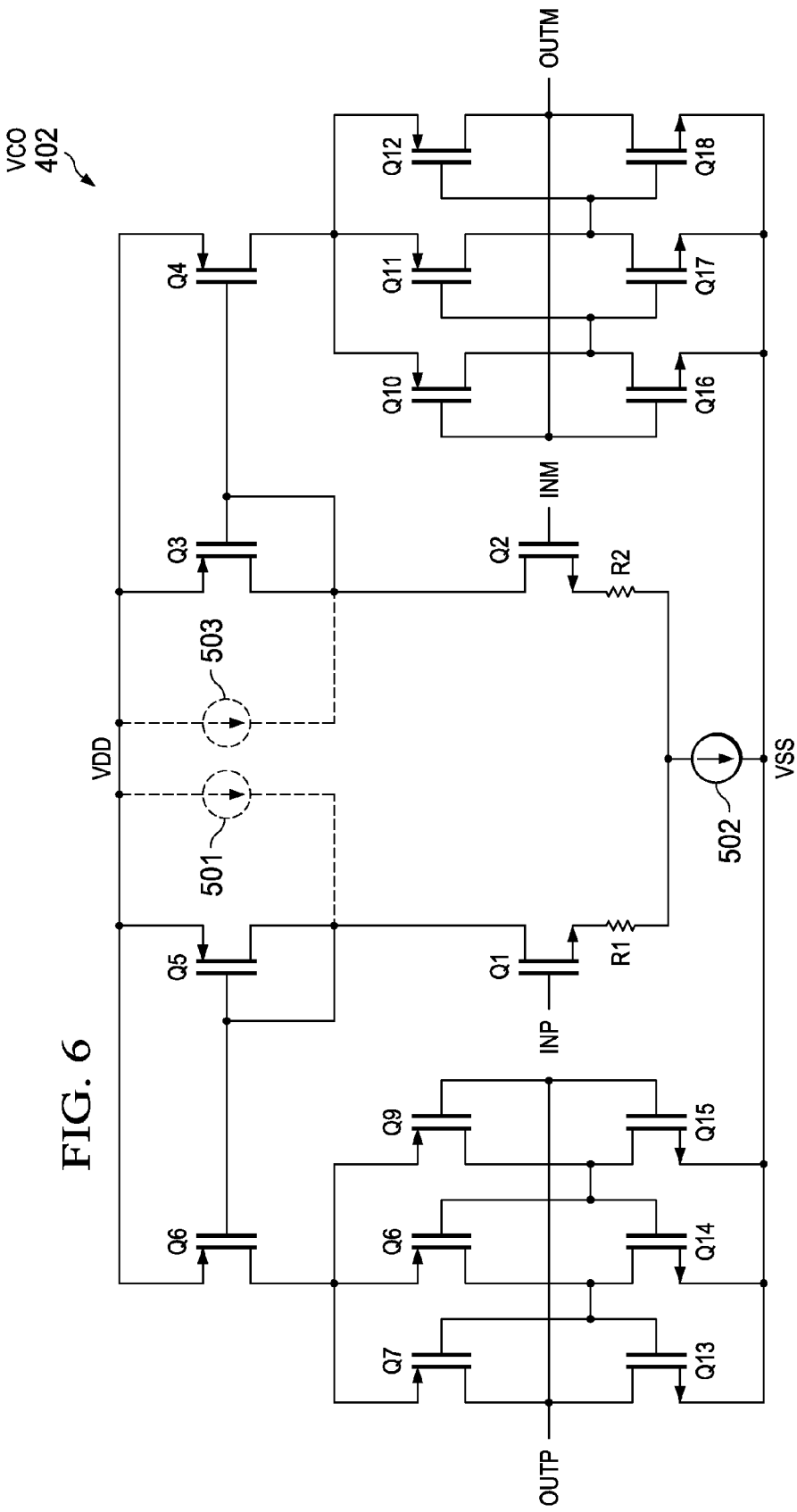
FIG. 6 is a diagram of an example of the voltage controlled oscillator (VCO) of the sub-ADC of FIG. 5.

Generating the output signal OUTP and OUTM in VCO 402 (which can be seen in greater detail in FIG. 6) is generally accomplished by use of a ring oscillator. Because this example implementation is differential, separate sets of inverter strings coupled together to form rings. Transistors Q7-Q9 and Q13-Q15 (which can, for example, be PMOS and NMOS transistors, respectively) generally form the inverter string for portion OUTP, and transistors Q10-Q12 and Q16-Q18 (which can, for example, be PMOS and NMOS transistors, respectively) generally form the inverter string for portion OUTM. Differential pair Q1 and Q2 (which are, for example, NMOS transistors and which are coupled to resistors R1 and R2 and current source 502) can then control the inverter strings for signal OUTP and OUTM. Specifically, based on the input signal INP and INM provided to the differential pair Q1 and Q2, the currents through each branch of the differential pair Q1 and Q2 vary in proportion, and current minors Q5/Q6 and Q3/Q4 (which are coupled to the differential pair Q1 and Q2 and which, for example, can be PMOS transistors) can mirror these currents that are generated in response to the input signal INP and INM so as to control the inverter strings. Current sources 501 and 503 can also be included so as to provide a higher VCO gain.

Figure 7:
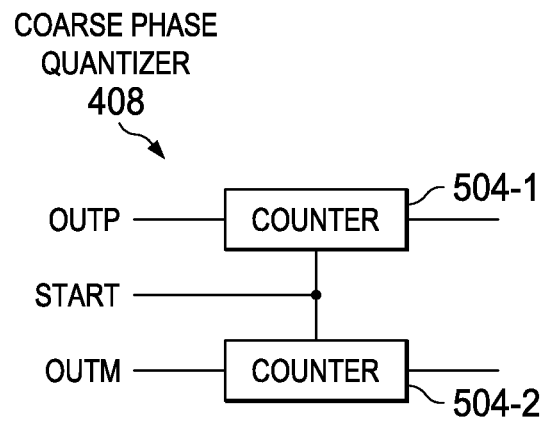
FIG. 7 is a diagram of an example of the coarse phase quantizer of the sub-ADC of FIG. 5.

With output signal OUTP and OUTM, the coarse phase quantizer 406 (as shown in more detail in FIG. 7) and the fine phase quantizer 408 (which can be seen in greater detail in FIG. 8) can perform coarse and fine measurements. The coarse phase quantizer 406 generally comprises counters 504-1 and 504-2 that receive portions OUTP and OUTM, respectively, so as to roughly determine the number of periods for each of portions OUTP and OUTM for a measurement interval (which generally occurs during a measurement interval between a rising edge and a falling edge of the start signal START). The fine phase quantizer 408 is generally comprised of time-to-digital converter (TDC) units 510-1 to 510-6 (where units 510-1 to 510-3 are used for portion OUTP and units 510-4 to 510-6 are used for portion OUTM). These TDC units 510-1 to 510-6 use flip-flops 506-1 to 506-24 (which are, for example, D-type flip-flops) that are clocked controlled by signals ST1, ST2, ST2, SP1, SP2, and SP3 and buffers 508-1 to 508-24, and propagation delay corresponds to a measurement. Each TDC unit 510-1 to 510-6 may also have a deeper or shallower pipeline than those depicted in FIG. 8.

Figure 9:
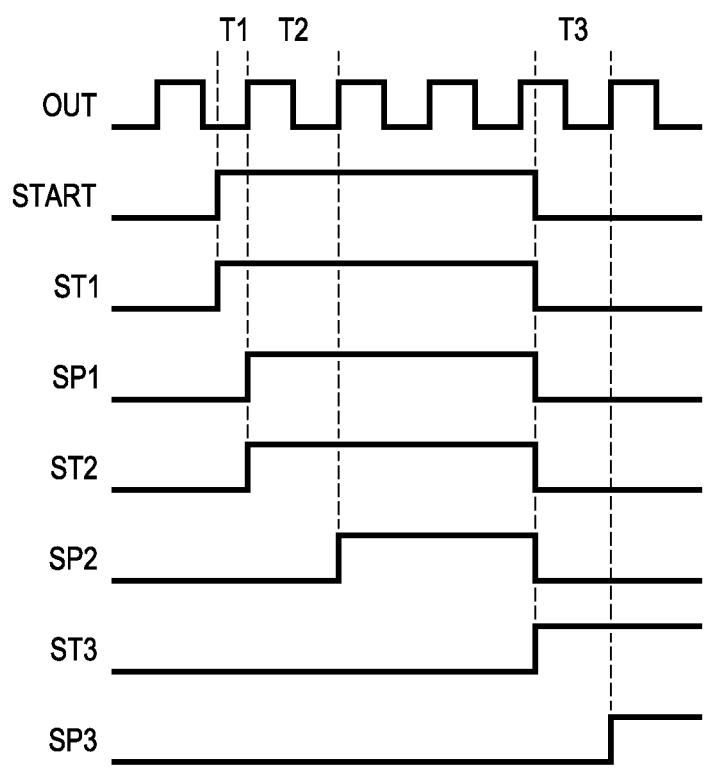
FIG. 9 is a timing diagram showing the operation of the quantizer of FIG. 5.

In FIG. 9, an example of the operation of the fine phase quantizer 408 can be seen. For this example, a fractional count or fine measurement for an output signal OUT (which can correspond to a single-ended output signal from VCO 402 or one of the portions OUTP and OUTPM) is performed. As shown, signal ST1 (which is used by units 510-1 and/or 510-4) transitions to logic high synchronously with the start signal START. This allows the signal to propagate across the strings of buffers 508-1 to 508-4 and/or 508-13 to 508-16, where there is a delay associated with each buffer. At the first rising edge of signal OUT following the rising edge of the start signal START, signal SP1 transitions to logic high, which allows flip-flops 506-1 to 506-4 and/or 506-13 to 506-16 to become transparent and which measures the propagation delay through the strings of buffers 508-1 to 508-4 and/or 508-13 to 508-16. The delay between the rising edge of the start signal START and the first rising edge of the signal OUT following the rising edge of the start signal START is denoted as interval T1. Similarly, signals ST2 and SP2 can be used by TDC units 510-2 and/or 510-5 to measure the period of the output signal (which is denoted by interval T2) between consecutive rising or falling edges of the signal OUT. Additionally, signals ST3 and SP3 are used by TDC units 510-3 and/or 510-6 to measure the interval T3 between the end of the measurement interval or falling edge of the start signal START and the next rising edge of the signal OUT. These intervals T1, T2, and T3 can then be used by the controller 406 to calculate the fractional count or fine measurement, which is done by dividing the difference between intervals T1 and T3 by the interval T2 (i.e., FCOUNT=T1−T3)/T2). Additionally, signals ST1, SP1, ST2, SP2, ST3, and SP3 can be generated by the controller 406 or another timing circuit.

As a result of using this configuration for ADC 300, several advantages can be realized. First, using a differential VCO (like VCO 402) can lead to improved linearity in voltage-to-frequency transfer function because of cancellation of second harmonic. Second, the coarse/fine quantization approach (employed by quantizer 404) consumes much less power that using multi-phase VCO with multiple counter because the TDCs (in the coarse phase quantizer 408) can operate on a small fraction of the oscillation period.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a plurality of data conversion stages coupled together in a sequence to form a pipeline, wherein the last data conversion stage of the sequence includes:
a sample-and-hold (S/H) circuit;
a voltage controlled oscillator (VCO) that is coupled to the S/H circuit;
a coarse phase quantizer that is coupled to the VCO;
a fine phase quantizer that is coupled to the VCO; and
a controller that is coupled to the coarse and fine phase quantizer; and
an output circuit that is coupled to each of the plurality of data conversion stages.

2. The apparatus of claim 1, wherein the coarse phase quantizer further comprises a counter that is coupled to receive an output signal from the VCO and that receives a start signal.

3. The apparatus of claim 2, wherein the fine phase quantizer further comprises:
a first time-to-digital converter (TDC) unit that is coupled to the VCO and the controller, wherein the first TDC unit measures a first interval between the an edge of the start signal initiating the counter and a first edge of the output signal from the VCO;
a second TDC unit that is coupled to the VCO and the controller, wherein the second TDC measures the period of the output signal from the VCO; and
a third TDC unit that is coupled to the VCO and the controller, wherein the third TDC measures a second interval between an edge of the start signal stopping the counter and a second edge of the output signal from the VCO.

4. The apparatus of claim 3, wherein the controller obtains a fractional count by dividing the difference between the first and second intervals by the period of the output signal from the VCO.

5. The apparatus of claim 4, wherein the edge of the start signal initiating the counter is a rising edge of the start signal, and wherein the first edge of the output signal from the VCO is the first rising edge of the output signal from the VCO following the rising edge of the start signal, and wherein edge of the start signal stopping the counter is a falling edge of the start signal, and wherein second edge of the output signal from the VCO is the first falling edge of the output signal from the VCO following the falling edge of the start signal.

6. The apparatus of claim 5, wherein the VCO further comprises a ring oscillator.

7. The apparatus of claim 6, wherein the first stage of the sequence further comprises:
an input terminal;
a sub-analog-to-digital converter (ADC) that is coupled to the input terminal and to the output circuit; and
a multiplying digital-to-analog converter (MDAC) that is coupled to the sub-ADC.

8. A method comprising:
generating a digital representation of a portion of an analog signal;
sampling residue of the analog signal at a sampling instant so as to generate a residue sample;
generating a signal having a frequency that is proportional to the voltage of the residue sample;
measuring the signal to generate coarse and fine measurements of the frequency; and
generating a digital representation of the residue sample from the coarse and fine measurements.

9. The method of claim 8, wherein the step of measuring the signal further comprises counting a number of periods of the signal during a measurement interval to generate the coarse measurement.

10. The method of claim 9, wherein the step of measuring the signal further comprises:
measuring the length of a first interval between initiation of the measurement interval and a first edge of the signal;
measuring the period of the signal; and
measuring the length of a second interval between the end of the measurement interval and a second edge of the output signal.

11. The method of claim 10, wherein the step of measuring the signal further comprises determine the fine measurement by dividing the difference between the lengths of first and second intervals by the period of the signal.

12. The method of claim 11, wherein the analog signal further comprises a first analog signal, wherein the step of generating the digital representation of the portion of the first analog signal further comprises:
resolving a plurality of bits that correspond to the portion of the first analog signal;
converting the plurality of bits into a second analog signal; and
determining a difference between the first and second analog signals to generate the residue of the first analog signal.

13. An apparatus comprising:
an ADC pipeline having:
a first stage that generates a digital representation of a portion of an analog signal and that generates a residue signal;
a second stage having:
an S/H circuit that is coupled to the first stage so as to receive the residue signal;
a VCO that is coupled to the S/H circuit;
a coarse phase quantizer that is coupled to the VCO;
a fine phase quantizer that is coupled to the VCO; and
a controller that is coupled to the coarse and fine phase quantizer and that generates a digital representation of the residue signal; and an output circuit that is coupled to the first stage and the controller so as to receive the digital representations of the portion of the analog signal and the residue signal and that generates a digital signal from the digital representations of the portion of the analog signal and the residue signal.

14. The apparatus of claim 13, wherein the coarse phase quantizer further comprises a counter that is coupled to receive an output signal from the VCO and that receives a start signal.

15. The apparatus of claim 14, wherein the fine phase quantizer further comprises:
   a first TDC unit that is coupled to the VCO and the controller, wherein the first TDC unit measures a first interval between the an edge of the start signal initiating the counter and a first edge of the output signal from the VCO;
   a second TDC unit that is coupled to the VCO and the controller, wherein the second TDC measures the period of the output signal from the VCO; and
   a third TDC unit that is coupled to the VCO and the controller, wherein the third TDC measures a second interval between an edge of the start signal stopping the counter and a second edge of the output signal from the VCO.

16. The apparatus of claim 15, wherein the controller obtains a fractional count by dividing the difference between the first and second intervals by the period of the output signal from the VCO.

17. The apparatus of claim 16, wherein the edge of the start signal initiating the counter is a rising edge of the start signal, and wherein the first edge of the output signal from the VCO is the first rising edge of the output signal from the VCO following the rising edge of the start signal, and wherein edge of the start signal stopping the counter is a falling edge of the start signal, and wherein second edge of the output signal from the VCO is the first falling edge of the output signal from the VCO following the falling edge of the start signal.

18. The apparatus of claim 17, wherein the analog and residue signals are differential, and wherein the counter, the first TDC unit, the second TDC unit, and the third TDC unit further and respectively comprise positive and negative counters, positive and negative first TDC units, positive and negative second TDC units, and positive and negative third TDC units, and wherein the VCO further comprises:
   a differential input pair that receives a sample of the differential residue signal from the S/H circuit;
   first and second current minor that are coupled to the differential input pair;
   a first set of inverters coupled together to form a first ring, wherein the first current minor is coupled to each of the inverters from the first set of inverters, and wherein at least one of the inverters from the first set of inverters is coupled to the positive counter, the positive first TDC unit, the positive second TDC unit, and the positive third TDC unit; and
   a second set of inverters coupled together to form a second ring, wherein the second current mirror is coupled to each of the inverters from the second set of inverters, and wherein at least one of the inverters from the second set of inverters is coupled to the negative counter, the negative first TDC unit, the negative second TDC unit, and the negative third TDC unit.

19. The apparatus of claim 18, wherein the first stage further comprises:
   an input terminal;
   a sub-ADC that is coupled to the input terminal and to the output circuit; and
   an MDAC that is coupled to the sub-ADC.

20. The apparatus of claim 19, wherein the sub-ADC is a 5-bit flash ADC, and wherein the MDAC is a 5-bit MDAC, and wherein the digital representation of the residue signal is 9 bits wide.

* * * * *